United States Patent
Lin et al.

(10) Patent No.: US 12,176,386 B2
(45) Date of Patent: Dec. 24, 2024

(54) STORAGE CAPACITOR WITH MULTIPLE DIELECTRICS

(71) Applicant: NANYA TECHNOLOGY CORPORATION, New Taipei (TW)

(72) Inventors: Kai-Hung Lin, Taoyuan (TW); Jyun-Hua Yang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 248 days.

(21) Appl. No.: 17/751,936

(22) Filed: May 24, 2022

(65) Prior Publication Data

US 2023/0387188 A1    Nov. 30, 2023

(51) Int. Cl.
*H10B 12/00* (2023.01)
*H01L 49/02* (2006.01)

(52) U.S. Cl.
CPC .............. *H01L 28/56* (2013.01); *H01L 28/75* (2013.01); *H10B 12/033* (2023.02)

(58) Field of Classification Search
CPC ............... H10B 12/033; H10B 12/038; H10B 12/0387; H01L 29/66181; H01L 29/945; H01L 28/90; H01L 28/56; H01L 28/75
See application file for complete search history.

(56) References Cited

U.S. PATENT DOCUMENTS

| | | | |
|---|---|---|---|
| 6,265,741 B1 | 7/2001 | Schrems | |
| 6,313,033 B1* | 11/2001 | Chiang | H01L 28/40 438/654 |
| 11,145,710 B1* | 10/2021 | Kelkar | H01L 28/90 |
| 2003/0235947 A1* | 12/2003 | Park | H01L 21/0228 257/E21.018 |
| 2008/0125342 A1 | 5/2008 | Visintin et al. | |
| 2015/0171159 A1 | 6/2015 | Lim | |
| 2019/0245031 A1 | 8/2019 | Lin et al. | |
| 2023/0005925 A1* | 1/2023 | Jung | H01L 28/90 |
| 2023/0232607 A1* | 7/2023 | Lee | H01L 29/945 257/301 |

FOREIGN PATENT DOCUMENTS

| CN | 113314532 A | 8/2021 |
|---|---|---|
| TW | 297946 B | 2/1997 |
| TW | 439266 B | 6/2001 |
| TW | 488067 B | 5/2002 |
| TW | 200421565 A | 10/2004 |

(Continued)

OTHER PUBLICATIONS

Office Action and Search Report mailed on Jul. 20, 2023 related to Taiwanese Application No. 111143917.

(Continued)

*Primary Examiner* — Jose R Diaz
(74) *Attorney, Agent, or Firm* — Xuan Zhang

(57) ABSTRACT

The present application provides a storage capacitor with multiple dielectrics. The storage capacitor includes a lower electrode, an upper electrode, a first dielectric layer, a second dielectric layer and a third dielectric layer. The first dielectric layer covers the lower electrode, the second dielectric layer is disposed on the first dielectric layer, and the third dielectric layer is disposed on the second dielectric layer. The upper electrode is disposed on the third dielectric layer.

16 Claims, 20 Drawing Sheets

(56) References Cited

FOREIGN PATENT DOCUMENTS

| | | |
|---|---|---|
| TW | 200503244 A | 1/2005 |
| TW | 201334196 A | 8/2013 |
| TW | 202044545 A | 12/2020 |

OTHER PUBLICATIONS

Office Action and Search Report mailed on Feb. 5, 2024 related to Taiwanese Application No. 112105863.
Office Action and Search Report mailed on Apr. 19, 2024 related to Taiwanese Application No. 112105863.
Office Action and Search Report mailed on Apr. 1, 2024 related to U.S. Appl. No. 17/752,638.
Office Action and Search Report mailed on Jul. 26, 2024 related to Taiwanese Application No. 112105863.
Office Action and Search Report mailed on Oct. 7, 2024 related to Taiwanese Application No. 112105863.
Office Action and Search Report mailed on Aug. 7, 2024 related to U.S. Appl. No. 17/752,638.

* cited by examiner

STORAGE CAPACITOR WITH MULTIPLE DIELECTRICS

TECHNICAL FIELD

The present disclosure relates to a semiconductor structure with multiple dielectrics, and more particularly, to a capacitor of a semiconductor storage device with multiple dielectrics.

DISCUSSION OF THE BACKGROUND

Dynamic random-access memory utilizes capacitors to store bits of information within an integrated circuit. A capacitor is formed by placing a dielectric material between two electrodes formed from conductive materials. The ability of the capacitor to hold electrical charges (i.e., capacitance) is a function of the surface area of the electrodes, a distance between the electrodes, and a (relative) dielectric constant or k-value of the dielectric material, wherein the capacitance is proportional to the dielectric constant or k-value of the dielectric material. That is, the higher the dielectric constant or k-value of the dielectric material, the greater the electrical charge that can be held by the capacitor. Therefore, for a given desired capacitance, if the dielectric constant or k-value of the dielectric material is increased, the area of the capacitor can be decreased to maintain the same cell capacitance.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a storage capacitor. The storage capacitor includes a lower electrode, a first dielectric layer, a second dielectric layer, a third dielectric layer, and an upper electrode. The first dielectric layer covers the lower electrode. The second dielectric layer is disposed on the first dielectric layer. The third dielectric layer is disposed on the second dielectric layer. The upper electrode is disposed on the third dielectric layer.

In some embodiments, the first dielectric layer and the second dielectric layer comprise different materials.

In some embodiments, the first and third dielectric layers comprise a same material.

In some embodiments, the first dielectric layer, the second dielectric layer and the third dielectric layer comprise metallic oxide.

In some embodiments, the first dielectric layer comprises hafnium, zirconium, niobium, aluminum or titanium.

In some embodiments, the second dielectric layer comprises hafnium or zirconium.

In some embodiments, the first dielectric layer has a first thickness, the second dielectric layer has a second thickness greater than the first thickness, and the third dielectric layer has a third thickness less than the second thickness.

In some embodiments, a total of the first thickness and the third thickness is substantially less than the second thickness.

In some embodiments, a ratio of the second thickness to a total of the first thickness and the third thickness is substantially greater than 4.

In some embodiments, the lower electrode is of a pillar shape, a portion of the first dielectric layer attached to an outer surface of the lower electrode has a first outer diameter and a first inner diameter, a portion of the second dielectric layer surrounding the outer surface of the lower electrode has a second outer diameter and a second inner diameter, a portion of the third dielectric layer surrounding the outer surface of the lower electrode has a third outer diameter and a third inner diameter, a first difference between the first outer diameter and the first inner diameter is less than a second difference between the second outer diameter and the second inner diameter, and a third difference between the third outer diameter and the third inner diameter is less than the second difference.

In some embodiments, a total of the first difference and the third difference is substantially less than 2 nm.

In some embodiments, a total of the first difference and the third difference is substantially greater than 0.3 nm.

In some embodiments, the upper electrode has a substantially planar top surface.

In some embodiments, the upper electrode is of a pillar shape, a portion of the first dielectric layer surrounding an outer surface of the upper electrode has a first outer diameter and a first inner diameter, a portion of the second dielectric layer surrounding the outer surface of the upper electrode has a second outer diameter and a second inner diameter, a portion of the third dielectric layer attached to the outer surface of the upper electrode has a third outer diameter and a third inner diameter, a first difference between the first outer diameter and the first inner diameter is less than a second difference between the second outer diameter and the second inner diameter, and a third difference between the third outer diameter and the third inner diameter is less than the second difference.

In some embodiments, a total of the first difference and the third difference is substantially less than 2 nm.

In some embodiments, a total of the first difference and the third difference is substantially greater than 0.3 nm.

In some embodiments, the lower electrode is a doped region of a substrate, and the first dielectric layer, the second dielectric layer, the third dielectric layer and the upper electrode are disposed in the substrate.

One aspect of the present disclosure provides a method of fabricating a storage capacitor. The method includes steps of forming a lower electrode; depositing a first dielectric layer covering the lower electrode; depositing a second dielectric layer on the first dielectric layer; depositing a third dielectric layer on the second dielectric layer; and forming an upper electrode on the third dielectric layer.

In some embodiments, the first dielectric layer has a first thickness, the second dielectric layer has a second thickness greater than the first thickness, and the third dielectric layer has a third thickness less than the second thickness.

In some embodiments, a total of the first thickness and the third thickness is substantially less than the second thickness.

In some embodiments, a ratio of the second thickness to a total of the first thickness and the third thickness is substantially greater than 4.

In some embodiments, the first dielectric layer and the second dielectric layer comprise different metallic oxides.

In some embodiments, the first dielectric layer and the third dielectric layer comprise a same material.

In some embodiments, the second dielectric layer comprises hafnium or zirconium.

In some embodiments, the first dielectric layer comprises hafnium, zirconium, niobium, aluminum or titanium.

In some embodiments, the formation of the lower electrode includes steps of forming a trench in a substrate and doping a portion of the substrate exposed to the trench to form the lower electrode; the first dielectric layer, the second dielectric layer and the third dielectric layer are subsequently deposited in the trench, and a conductive material of the upper electrode is deposited on the third dielectric layer until the trench is entirely filled.

In some embodiments, the method further includes performing a planarization process to remove the first dielectric layer, the second dielectric layer, the third dielectric layer, and the conductive material above the substrate.

In some embodiments, the formation of the lower electrode includes steps of depositing a sacrificial layer on a substrate; forming a trench in the sacrificial layer; and depositing a conductive material of the lower electrode in the trench until the trench is entirely filled.

In some embodiments, the method further includes a step of performing a planarization process to remove the conductive material above the sacrificial layer.

In some embodiments, the method further includes a step of removing the sacrificial layer prior to the deposition of the first dielectric layer.

With the above-mentioned configurations of the storage capacitor including the three dielectric layers acting as a capacitor dielectric for electrically isolating the upper electrode and the lower electrode, an effective dielectric constant of the capacitor dielectric can be increased. Therefore, a storage capacitor of a given footprint can hold a greater electrical charge.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
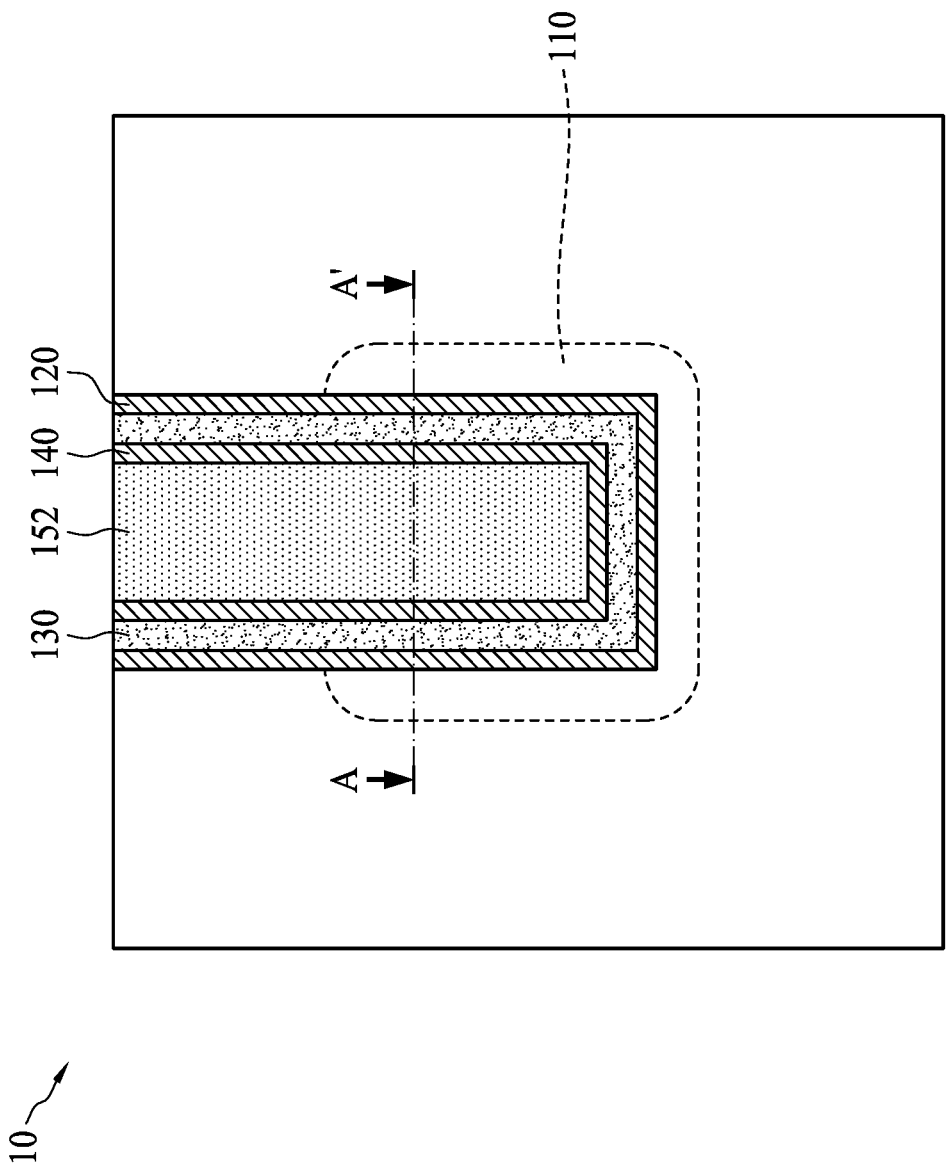
FIG. 1 shows a cross-sectional view of a storage capacitor in accordance with some embodiments of the present disclosure.

Embodiments, or examples, of the disclosure illustrated in the drawings are described below using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a storage capacitor 10 in accordance with some embodiments of the present disclosure. Referring to FIG. 1, the storage capacitor 10 is a trench capacitor and includes a lower electrode 110, a first dielectric layer 120, a second dielectric layer 130, a third dielectric layer 140 and an upper electrode 152; the lower electrode 110 is a conductive doped region of a substrate 100, and the first dielectric layer 120, the second dielectric layer 130, the third dielectric layer 140 and the upper electrode 152 are disposed in the substrate 100.

The lower electrode 110 and the upper electrode 152 are electrically isolated from each other by the first dielectric layer 120, the second dielectric layer 130 and the third dielectric layer 140. In other words, the first dielectric layer 120, the second dielectric layer 130 and the third dielectric layer 140 act as a capacitor dielectric of the storage capacitor 10. As illustrated in FIG. 1, the first dielectric layer 120 covers the lower electrode 110, and the second dielectric layer 130 is disposed between the first and third dielectric layers 120 and 140.

The first dielectric layer 120 and the second dielectric layer 130 have different materials to increase an effective dielectric constant of the capacitor dielectric of the storage capacitor 10. In addition, the first dielectric layer 120 and the third dielectric layer 140 can include a same material to facilitate the formation of the storage capacitor 10. The first dielectric layer 120, the second dielectric layer 130 and the third dielectric layer 140 include metallic oxides. For example, the first dielectric layer 120 and the third dielectric layer 140 include hafnium, zirconium, niobium, aluminum or titanium, and the second dielectric layer 130 includes hafnium or zirconium.

Figure 2:
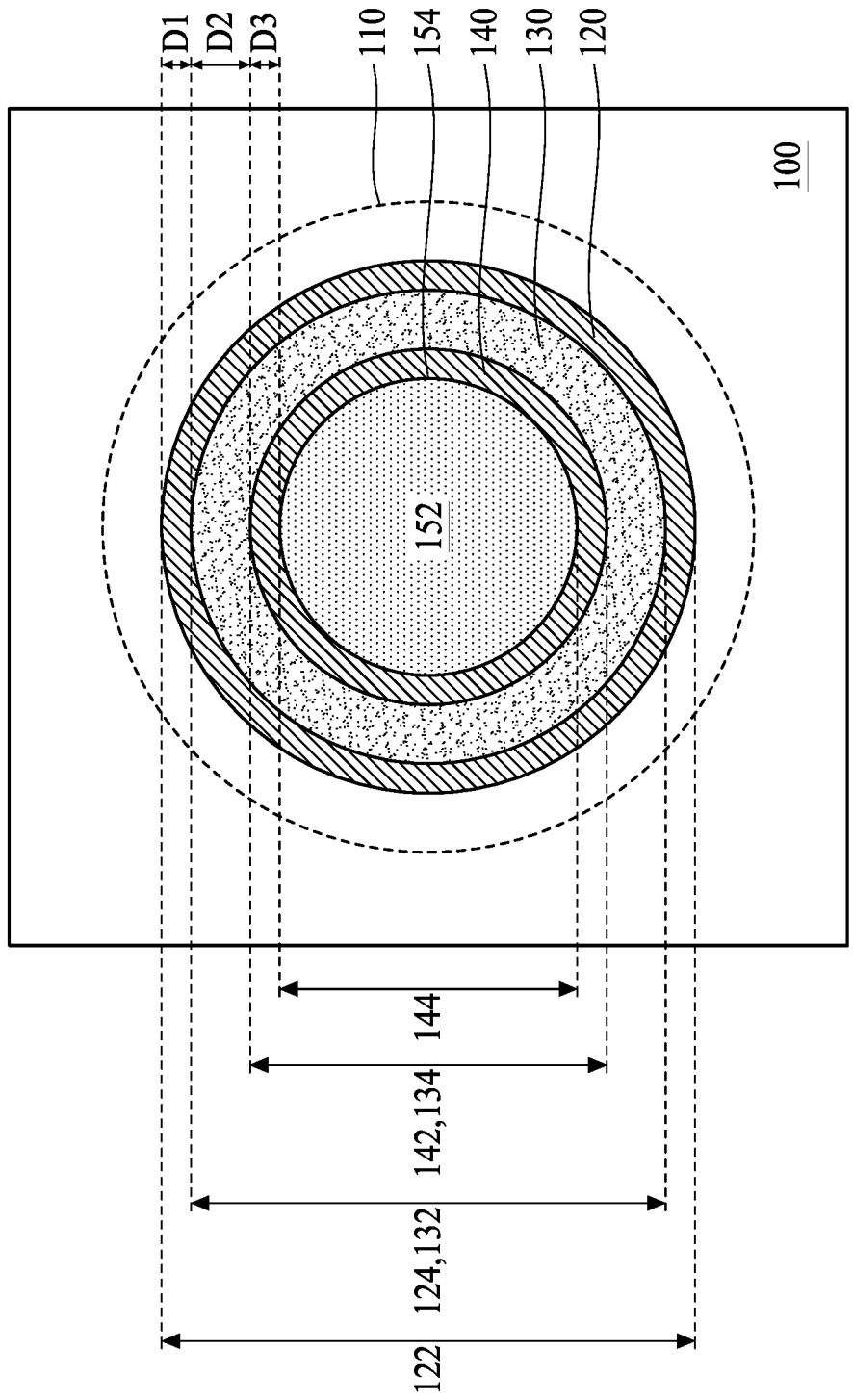
FIG. 2 is a cross-sectional view taken along a line A-A' in FIG. 1.

Referring to FIG. 2, the upper electrode 152 is of a pillar shape and includes an outer surface 154. A portion of the first dielectric layer 120 surrounding the outer surface 154 of the upper electrode 152 includes a first outer diameter 122 and a first inner diameter 124, and a portion of the second dielectric layer 130 surrounding the outer surface 154 of the upper electrode 152 has a second outer diameter 132 and a second inner diameter 134. In some embodiments, a first difference D1 between the first outer diameter 122 and the first inner diameter 124 is less than a second difference D2 between the second outer diameter 132 and the second inner diameter 134 to further increase the dielectric constant of the storage capacitor 10.

In addition, a portion of the third dielectric layer 140 attached to the outer surface 154 of the upper electrode 152 has a third outer diameter 142 and a third inner diameter 144, and a third difference D3 between the third outer diameter 142 and the third inner diameter 144 is less than the second difference D2 between the second outer diameter 132 and the second inner diameter 134. In some embodiments, a total of the first difference D1 and the third difference D3 is substantially less than 2 nm. Additionally, the total of the first difference D1 and the third difference D3 is substantially greater than 0.3 nm. In some embodiments, the first difference D1, the second difference D2 and the third difference D3 can be obtained using energy dispersive X-ray (EDX) measurement.

Figure 3:
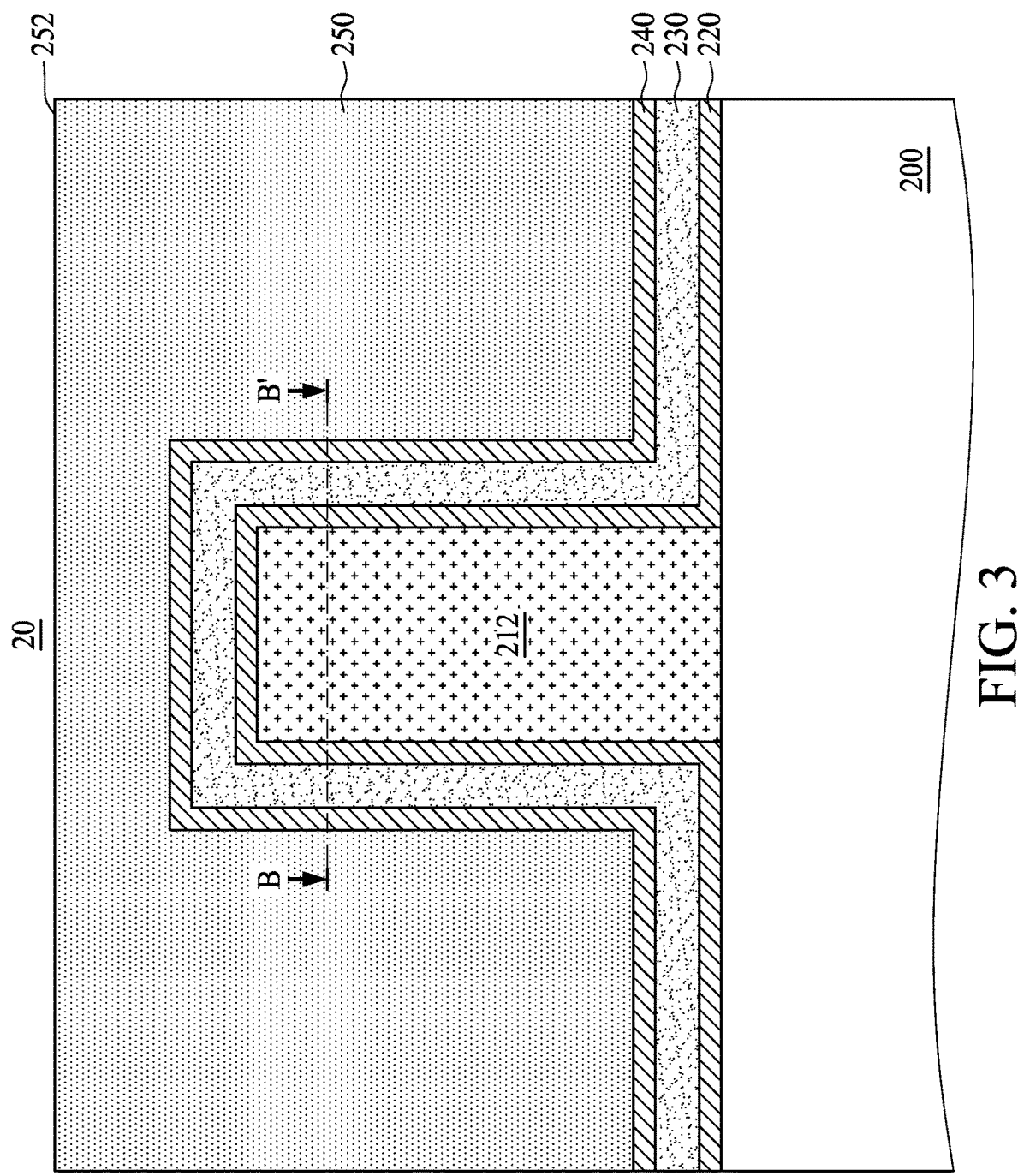
FIG. 3 shows a cross-sectional view of a storage capacitor in accordance with some embodiments of the present disclosure.

FIG. 3 is a cross-sectional view of a storage capacitor 20 in accordance with some embodiments of the present disclosure. Referring to FIG. 3, the storage capacitor 20 includes a lower electrode 212, a first dielectric layer 220 covering the lower electrode 212, a second dielectric layer 230 disposed on the first dielectric layer 220, a third dielectric layer 240 disposed on the second dielectric layer 230, and an upper electrode 250 disposed on the third dielectric layer 240. The lower electrode 212 may be disposed on a substrate 200 including an access transistor (not shown) formed therein. The substrate 200 can include a plurality of layers of different materials, the layers having regions of different materials or structures used to fabricate integrated circuits, active microelectronic devices (such as transistors and/or diodes) and passive microelectronic devices (such as capacitors, resistors or the like). The materials mentioned above may include semiconductors, insulators, conductors, or combinations thereof.

The first dielectric layer 220, the second dielectric layer 230 and the third dielectric layer 240 act as a capacitor dielectric for electrically isolating the lower electrode 212 from the upper electrode 250. The capacitor dielectric comprising the first dielectric layer 220, the second dielectric layer 230 and the third dielectric layer 240 can have a topology following the topology of the substrate 200 and the lower electrode 212, and the upper electrode 250 has a substantially planar top surface 252. Alternatively, the upper electrode 202 may have a uniform thickness. The first and second dielectric layers 220 and 230 can comprise different metallic oxides, and the first and third dielectric layers 220 and 240 comprise a same metallic oxide. For example, the first and third dielectric layers 220 and 240 include hafnium, zirconium, niobium, aluminum or titanium, and the second dielectric layer 230 includes hafnium or zirconium.

Figure 4:
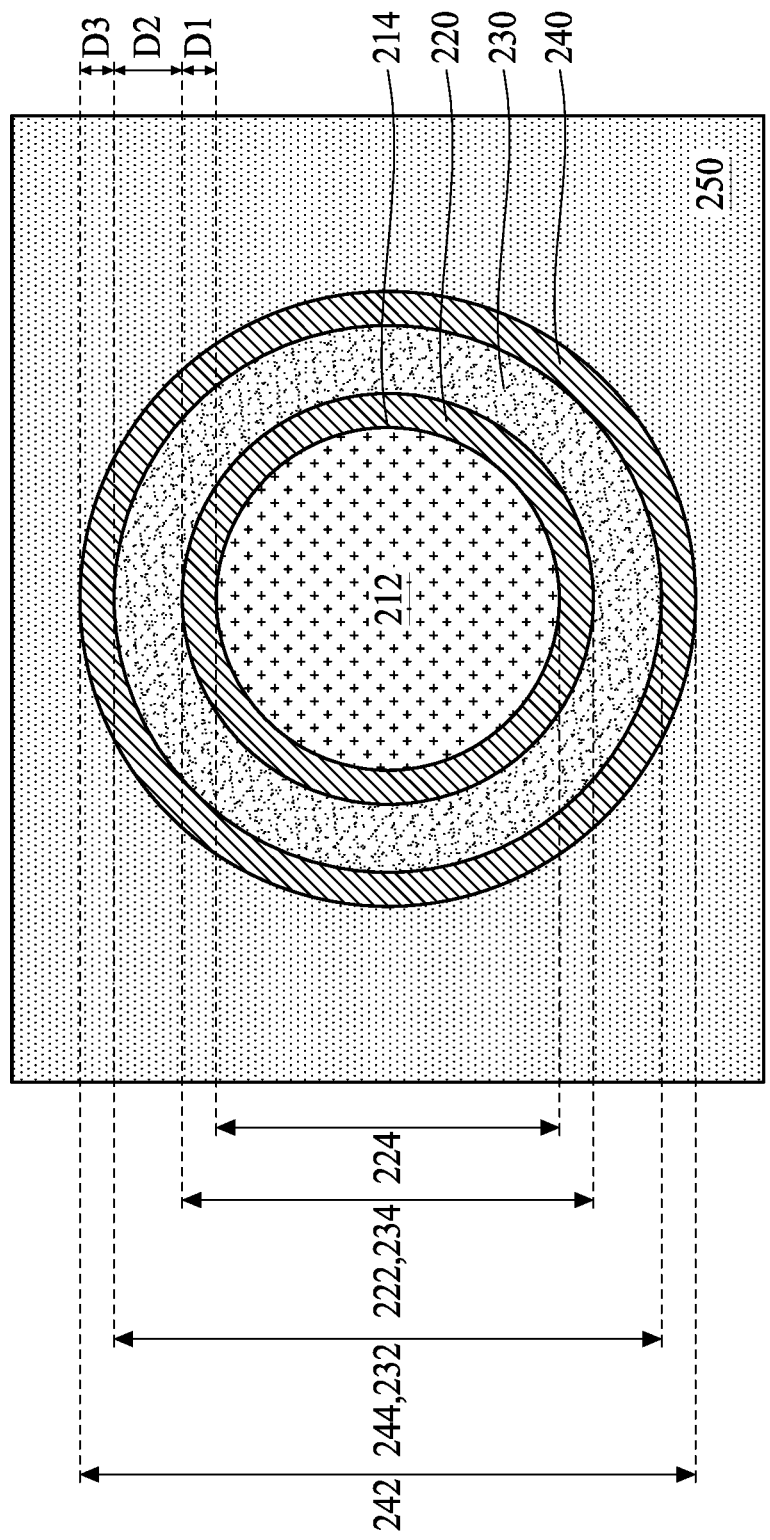
FIG. 4 is a cross-sectional view taken along a line B-B' in FIG. 3.

Referring to FIG. 4, a portion of the first dielectric layer 220 attached to an outer surface 214 of the lower electrode 212 includes a first outer diameter 222 and a first inner diameter 224, a portion of the second dielectric layer 230 surrounding the outer surface 214 of the lower electrode 212 has a second outer diameter 232 and a second inner diameter 234, and a first difference D1 between the first outer diameter 222 and the first inner diameter 224 is less than a second difference D2 between the second outer diameter 232 and the second inner diameter 234. In addition, a portion of the third dielectric layer 240 surrounding the outer surface 214 of the lower electrode 212 has a third outer diameter 242 and a third inner diameter 244, and a third difference D3 between the third outer diameter 242 and the third inner diameter 244 is less than the second difference D2. In some embodiments, a total of the first difference D1 and the third difference D3 is in a range of about 0.3 to about 2 nm.

Figure 5:
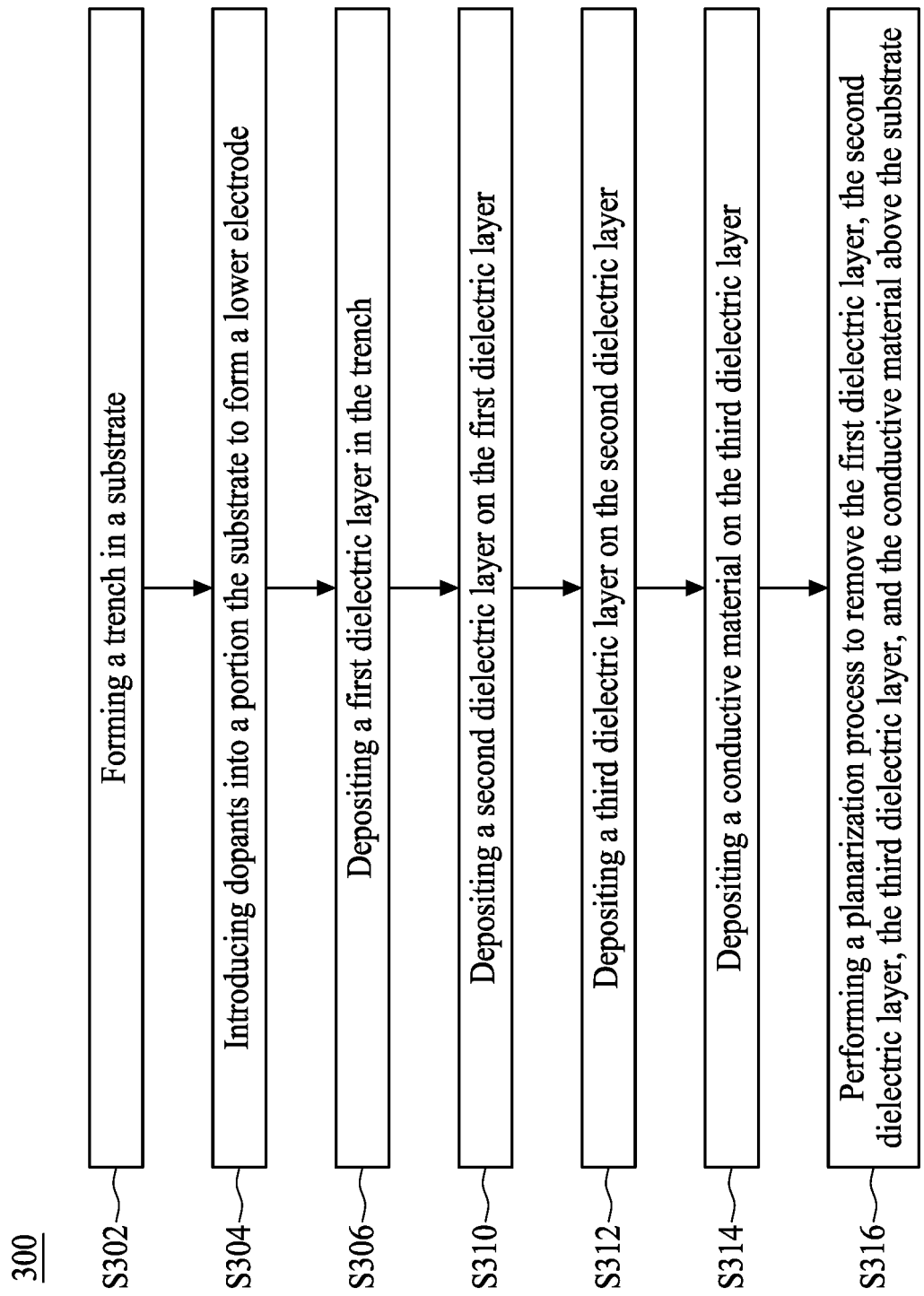
FIG. 5 is a flow diagram illustrating a method of fabricating a storage capacitor in accordance with some embodiments of the present disclosure.

FIG. 5 shows a flow diagram illustrating a method 300 of fabricating a storage capacitor 10 in accordance with some embodiments of the present disclosure, and FIGS. 6 through 12 illustrate cross-sectional views of intermediate stages in the fabrication of the storage capacitor 10 in accordance with some embodiments of the present disclosure. The stages shown in FIGS. 6 to 12 are referred to in the flow diagram in FIG. 5. In the following discussion, the fabrication stages shown in FIGS. 6 to 12 are discussed in reference to the process steps shown in FIG. 5.

Figure 6:
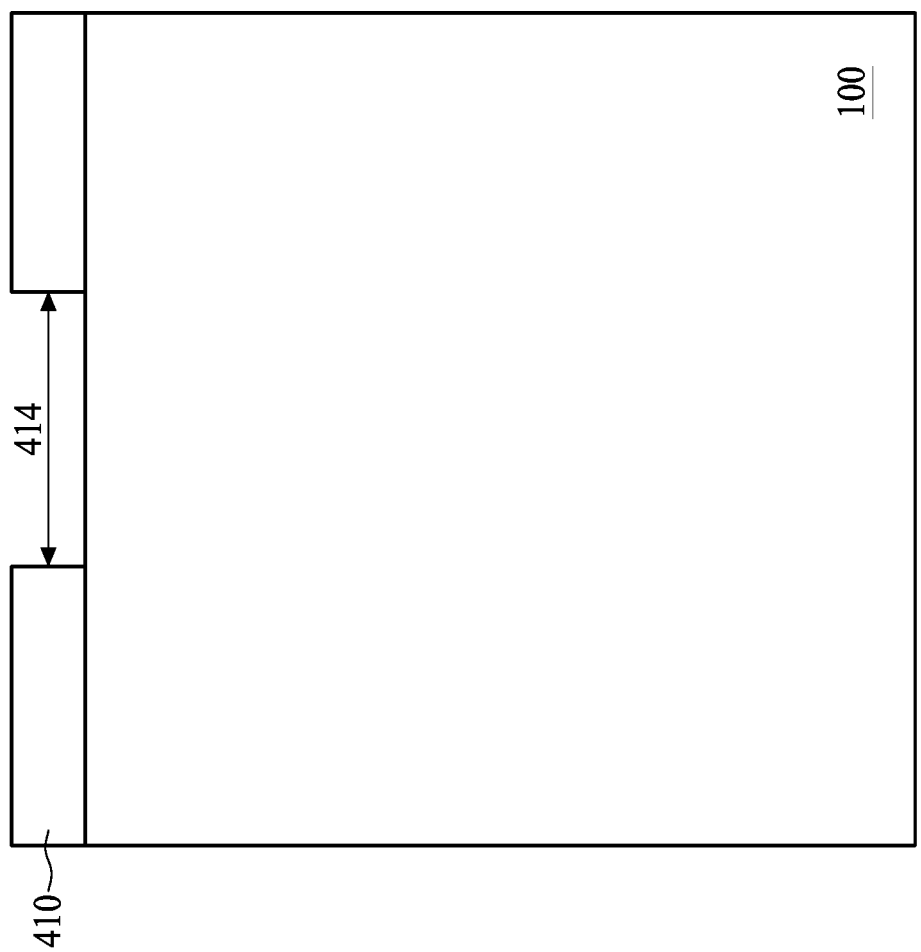
FIGS. 6 through 12 illustrate cross-sectional views of intermediate stages in the formation of the storage capacitor in accordance with some embodiments of the present disclosure.
Figure 7:
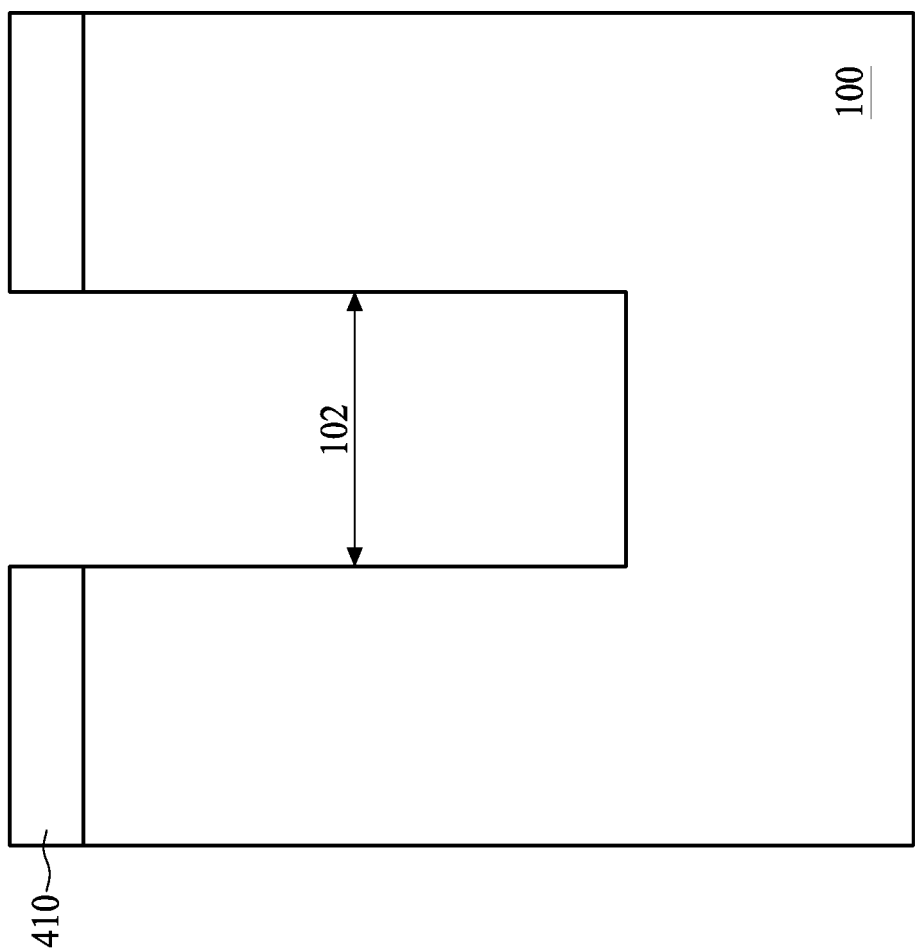

Referring to FIGS. 6 and 7, a trench 102 is formed in a substrate 100 according to step S302 in FIG. 5. The substrate 100 can be a bulk semiconductor, a semiconductor-on-insulator (SOI) substrate, a multi-layered or gradient substrate, or the like. The substrate 100 may include any semiconductor material, such as an elemental semiconductor like silicon, germanium, or the like; or a compound or alloy semiconductor including silicon carbide, gallium arsenide, gallium phosphide, indium phosphide, indium phosphide, indium arsenide, or the like.

The formation of the trench 102 may include (1) forming a pattern mask 410 on the substrate 100, wherein the pattern mask 410 defines a trench pattern to be etched into the substrate 100, and (2) performing an etching process, such as a dry etching process, to remove a portion of the substrate 100 not protected by the pattern mask 410 and thereby forming the trench 102 in the substrate 100.

The pattern mask 410 can be a photoresist mask or a hard mask. The pattern mask 410 that includes photosensitive material can be formed by performing at least one exposure process and at least one develop process on the photosensitive material that fully covers the substrate 100, wherein the photosensitive material may be applied on the substrate 100 by a spin-coating process and then dried using a soft-baking process. Alternatively, the pattern mask 410 that is a hard mask can made of polysilicon, carbon, inorganic materials (such as nitride) or other suitable material.

The substrate 100 is etched using a reactive-ion etching (RIE) process, for example, so that a width of a window 414 in the pattern mask 410 is maintained in the trench 102. Following the formation of the trench 102, a wet chemical cleaning or alternative cleaning process may be performed in order to substantially remove any surface contaminants that may remain in the trench 102. After the formation of the trench 102, the pattern mask 410 is removed using a suitable process. The pattern mask 410 that includes photosensitive material is removed using an ashing process or a wet strip process, while the pattern mask 410 that is the hard mask is removed using a wet etching process.

Figure 8:
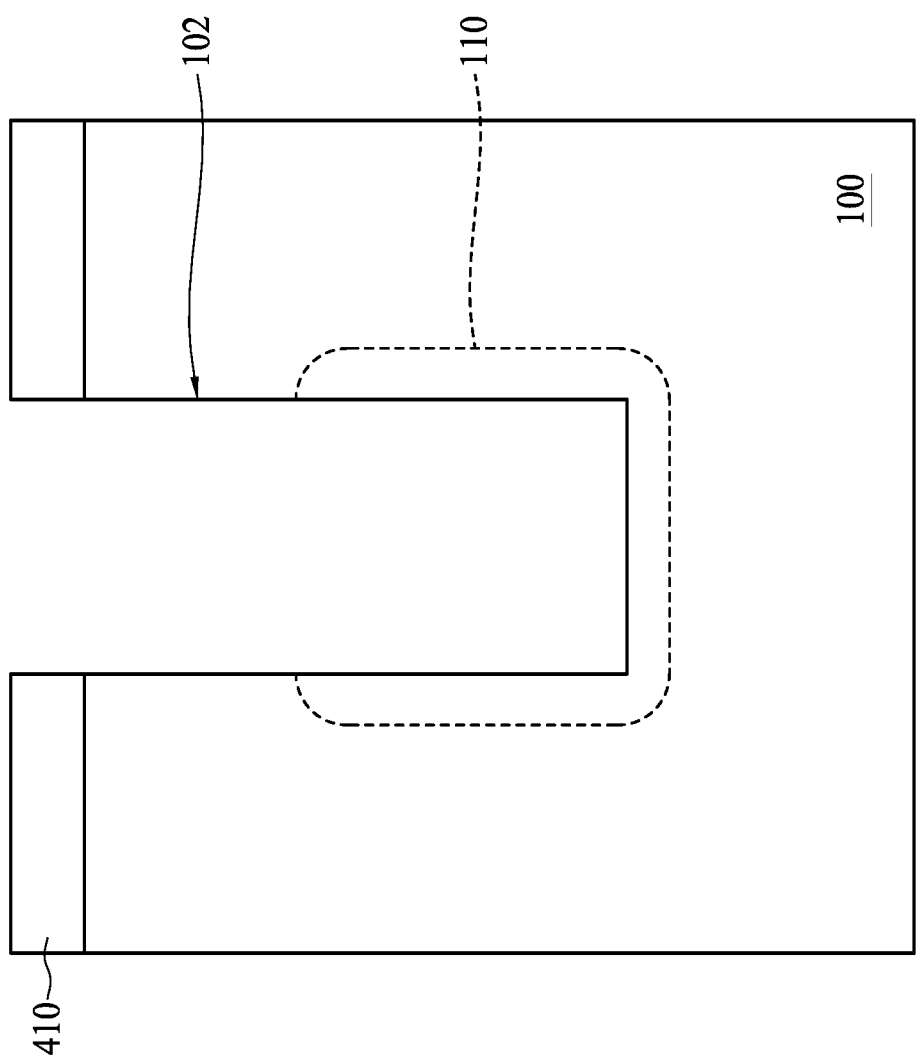

Referring to FIG. 8, dopants are introduced into a portion of the substrate 100 exposed to the trench 102 to form a lower electrode 110 according to step S304 in FIG. 3. The formation of the lower electrode 110 may include (1) depositing a sacrificial material (not shown) to partially fill the trench 102, (2) forming a passivation liner (not shown) on an exposed portion of the substrate 100 and on the sacrificial material, (3) removing horizontal portions of the passivation liner, (4) removing the sacrificial material, (5) introduced the dopants into the portion of the substrate 100 not protected by the remaining passivation liner, and (6) removing the remaining passivation liner. Dopants can be introduced into the portion of the substrate 100, for example, by out-diffusion from a dopant-including disposable material (such as doped silicate glass) or by ion implantation. The doped region of the substrate 100 can be n-type or p-type.

Figure 9:
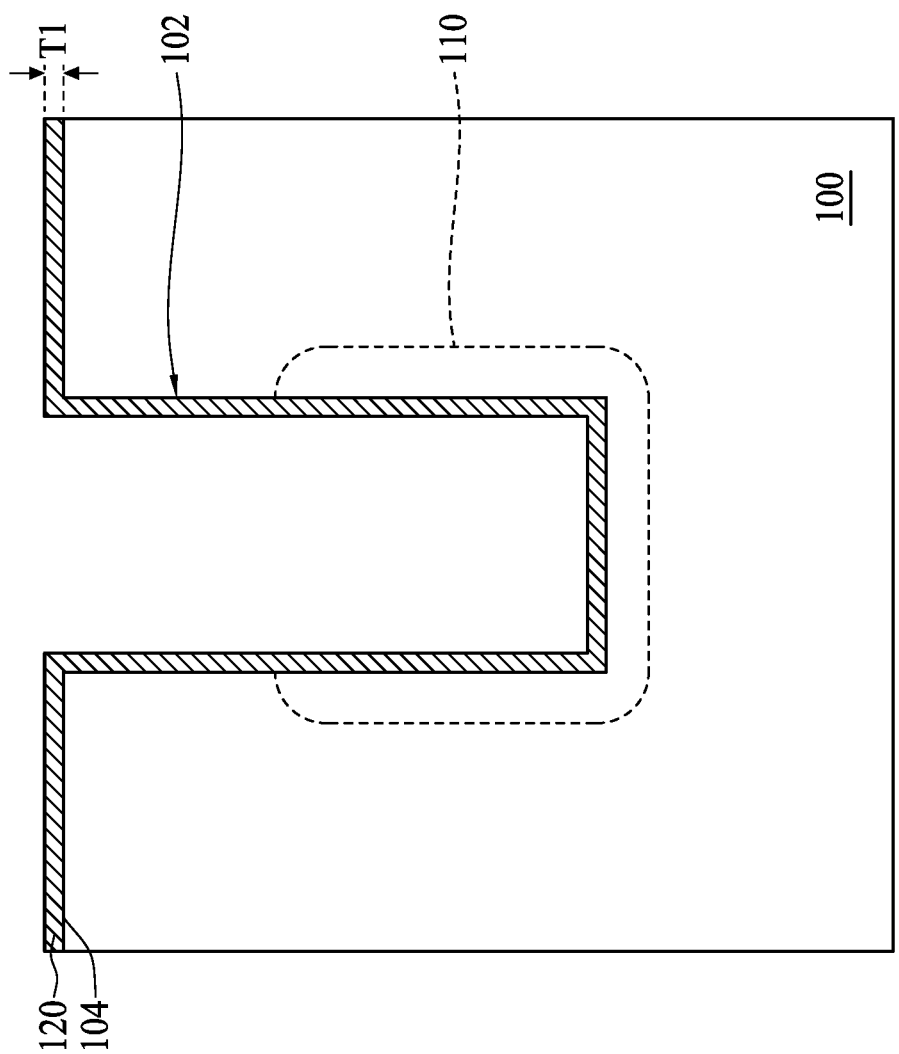

Referring to FIG. 9, a first dielectric layer 120 is deposited on an exposed portion of the substrate 100 according to step S306 in FIG. 5. The first dielectric layer 120 is conformally and uniformly deposited in the trench 102 and on an upper surface 104 of the substrate 100, but does not fill the trench 102. As illustrated in FIG. 9, the first dielectric layer 120 has a substantially uniform first thickness T1 and has a topology following the topology of the substrate 110 exposed to the trench 102. The first dielectric layer 120 includes a first metallic oxide. The first metallic oxide may be selected from hafnium oxide ($HfO_2$), zirconium dioxide ($ZrO_2$), niobium oxide ($Nb_2O_5$), aluminum oxide ($Al_2O_3$) or titanium dioxide ($TiO_2$). By way of example, the first dielectric layer 120 may be deposited using a physical vapor deposition (PVD) process, a chemical vapor deposition (CVD) process or an atomic layer deposition (ALD) process, for example, wherein the first dielectric layer 120 deposited using the ALD process is highly uniform in thickness.

Figure 10:
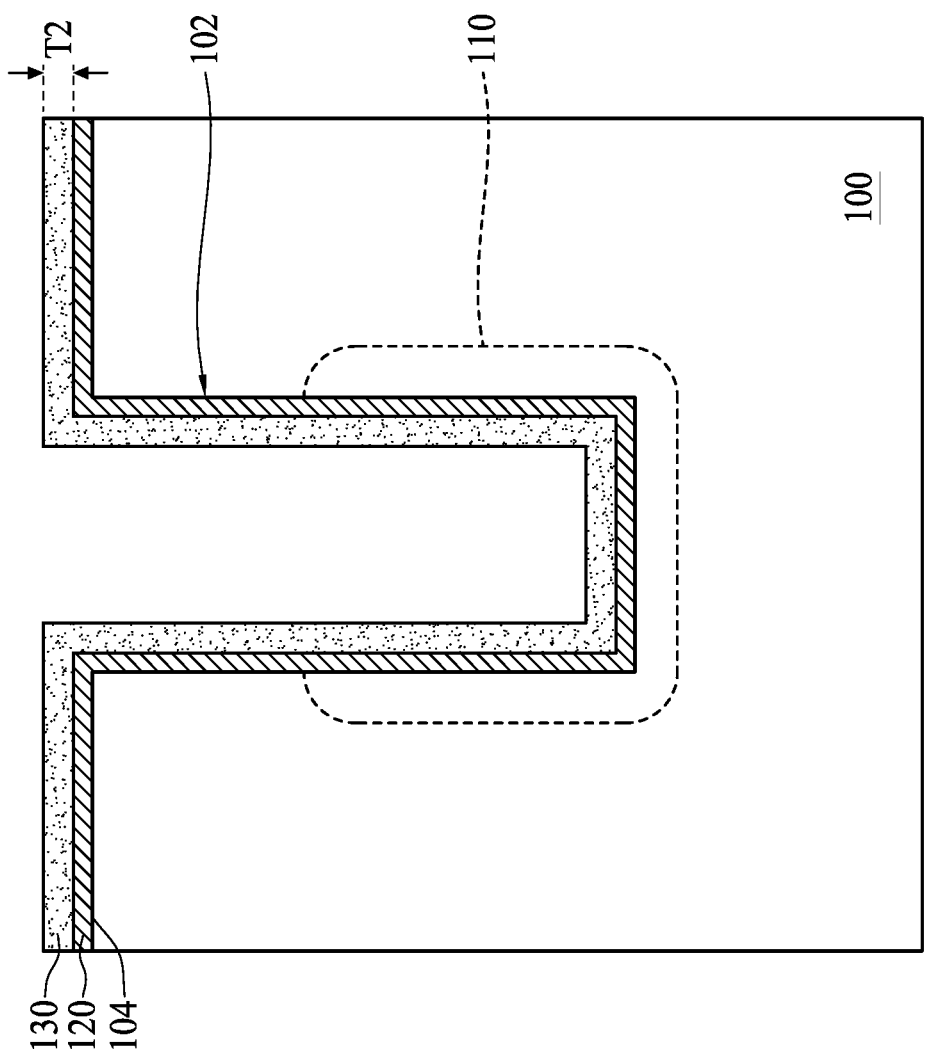

Referring to FIG. 10, a second dielectric layer 130 is deposited on the first dielectric layer 120 according to step S310 in FIG. 5. The second dielectric layer 130, having a substantially uniform second thickness T2, covers the first dielectric layer 120, but does not fill the trench 102. In some embodiments, the second thickness T2 is greater than the first thickness T1, shown in FIG. 9. The second dielectric layer 130 can include a second metallic oxide different from the first metallic oxide. For example, the second dielectric layer 130 may be selected from hafnium oxide and zirconium dioxide. The second dielectric layer 130 may be formed using a PVD process, an ALD process or a CVD process, for example.

Figure 11:
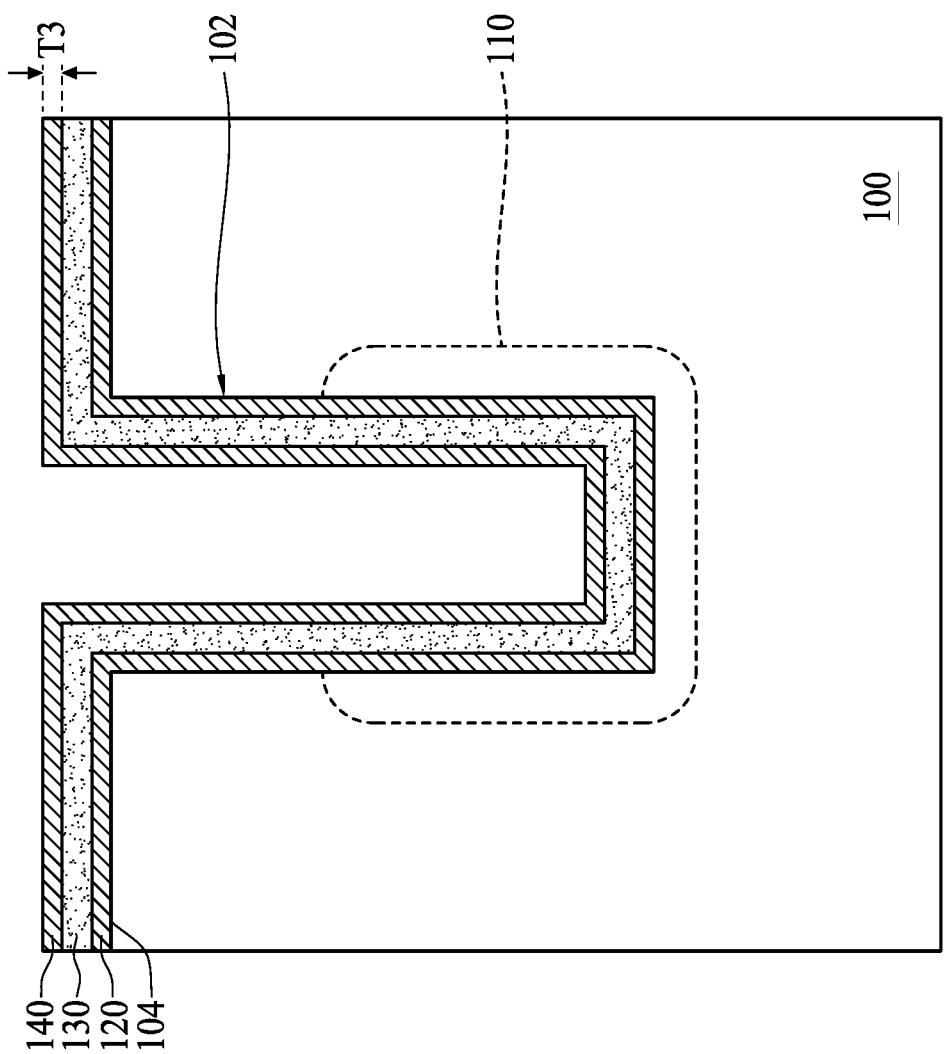

Referring to FIG. 11, a third dielectric layer 140 is deposited on the second dielectric layer 130 according to step S312 in FIG. 5. The third dielectric layer 140 is conformally and uniformly deposited in the trench 102 and over an upper surface 104 of the substrate 100, but does not fill the trench 102. The third dielectric layer 140, including a first metallic material, can be formed using a PVD process, a CVD process or an ALD process, for example.

Referring to FIGS. 9 to 11, the third dielectric layer 140 has a third thickness T3 less than the second thickness T2 of the second dielectric layer 130. In addition, a total of the first thickness T1 and the third thickness T3 is substantially less than the second thickness T2 to increase an effective dielectric constant of the first to third dielectric layers 120 to 140. In some embodiments, a ratio of the second thickness T2 to a total of the first thickness T1 and the third thickness T3 is substantially greater than 4.

Figure 12:
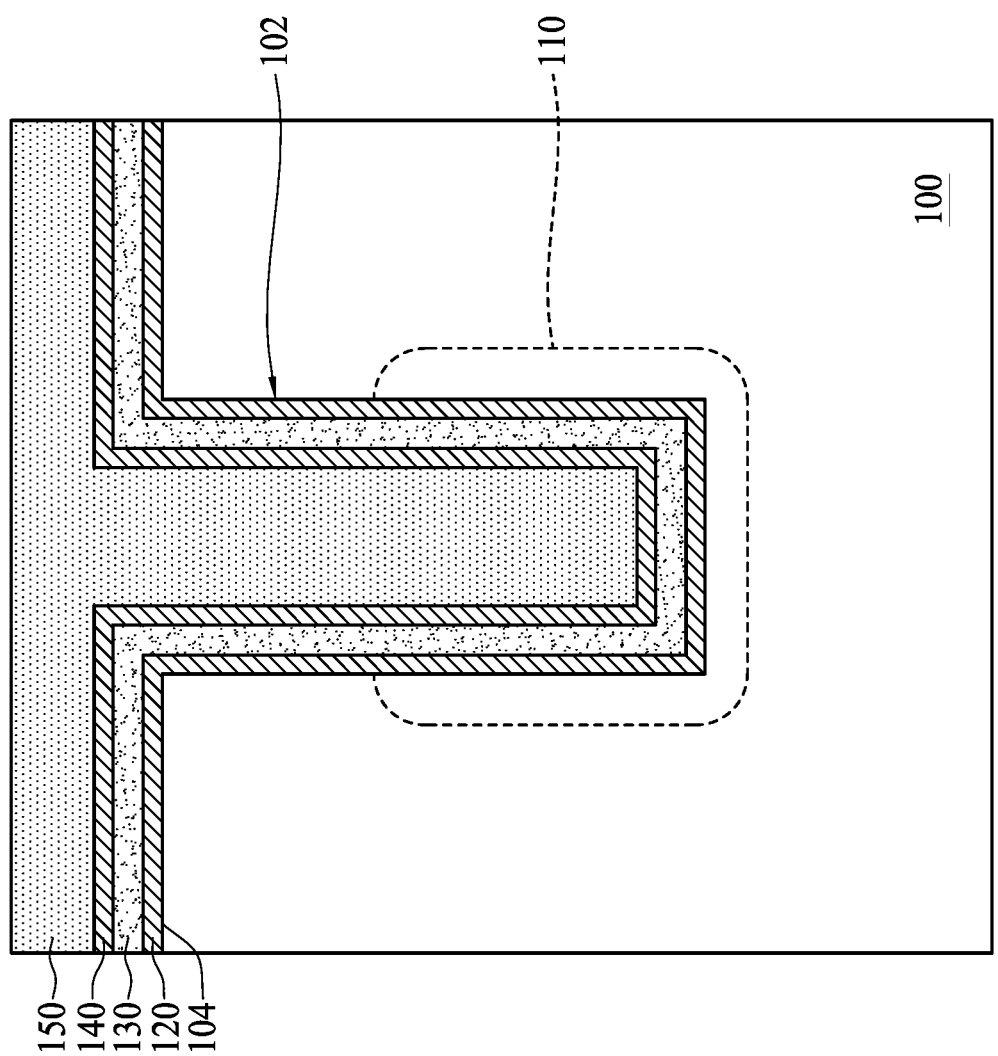

Referring to FIG. 12, a conductive material 150 is deposited to fill the trench 102 according to step S314 in FIG. 5. The conductive material 150 is conformally and uniformly deposited on the substrate 100 and in the trench 102 until the trench 102 is entirely filled to facilitate the deposition of the conductive material 150. The conductive material 150 includes polysilicon or metal, such as tungsten, copper, aluminum, molybdenum, titanium, tantalum, ruthenium, or a combination thereof. The conductive material 150 may be formed using a CVD process, a PVD process, an ALD process or another suitable process.

After the deposition of the conductive material 150, a planarization process is performed to remove portions of the first dielectric layer 120, the second dielectric layer 130, the third dielectric layer 140 and the conductive material 150 above the upper surface 104 of the substrate 100. Accordingly, an upper electrode 152 of a pillar shape is formed, thereby forming the storage capacitor 10 shown in FIG. 1. The superfluous first dielectric layer 120, the superfluous second dielectric layer 130, the superfluous third dielectric layer 140 and the superfluous conductive material 150 can be removed from the substrate 100 using, for example, a chemical mechanical polishing (CMP) process.

Figure 13:
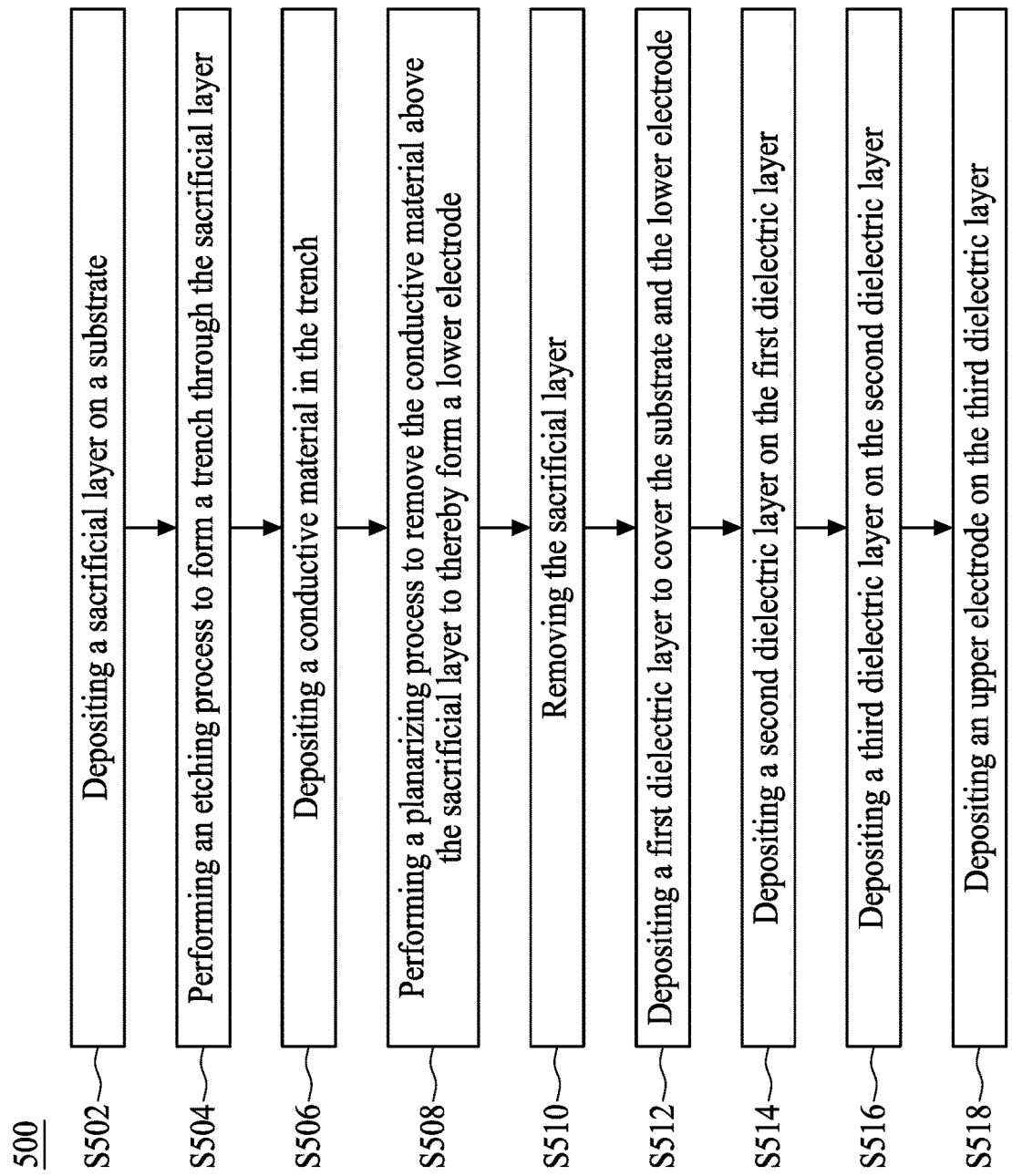
FIG. 13 is a flow diagram illustrating a method of fabricating a storage capacitor of a semiconductor storage device in accordance with some embodiments of the present disclosure.

FIG. 13 shows a flow diagram illustrating a method 500 of fabricating a storage capacitor 20 in accordance with some embodiments of the present disclosure, and FIGS. 14 through 20 illustrate cross-sectional views of intermediate stages in the fabrication of the storage capacitor 20 in accordance with some embodiments of the present disclosure. The stages shown in FIGS. 14 to 20 are referred to in the flow diagram in FIG. 13. In the following discussion, the fabrication stages shown in FIGS. 14 to 20 are discussed in reference to the process steps shown in FIG. 13.

Figure 14:
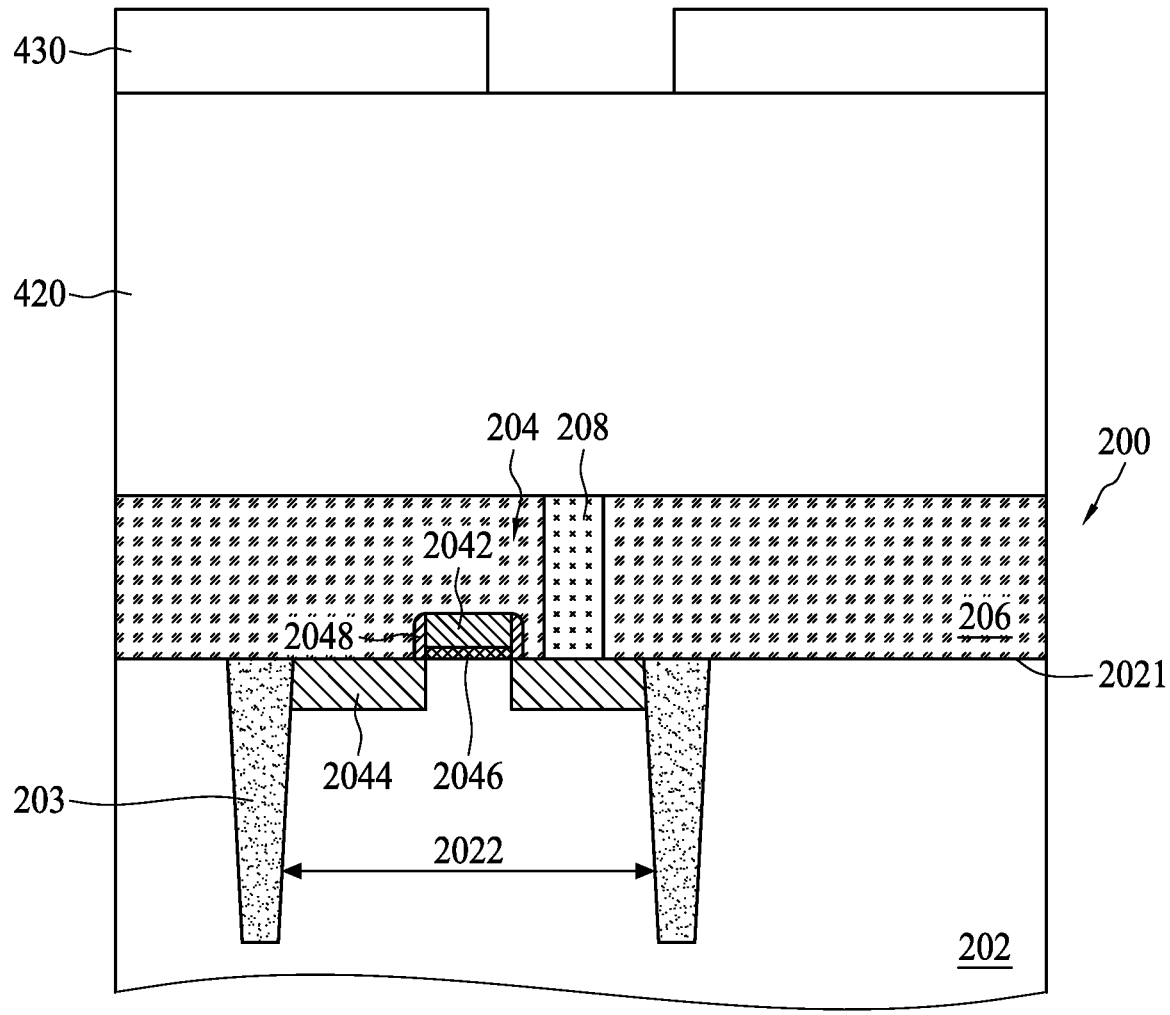
FIGS. 14 through 20 illustrate cross-sectional views of intermediate stages in the formation of the storage capacitor in accordance with some embodiments of the present disclosure.

Referring to FIG. 14, a sacrificial layer 420 is deposited on a substrate 200 according to step S502 in FIG. 13. In some embodiments, the substrate 200 includes a semiconductor wafer 202, an access transistor 204, an insulative layer 206 and a conductive feature 208. The access transistor 204 includes a gate electrode 2042, a plurality of impurity regions 2044 and a gate dielectric 2046. The gate electrode 2042 is disposed over the semiconductor wafer 202. The impurity regions 2044 are disposed in the semiconductor wafer 202 and on either sides of the gate electrode 2042. The gate dielectric 2046 is sandwiched between semiconductor wafer 202 and the gate electrode 2042. That is, the access transistor 202 shown in FIG. 14 is in a form of a planar access device (PAD) transistors; however, in some embodiments, the access transistor 202 may be a recessed access device (RAD) transistor.

In some embodiments, the gate electrode 2042 may include, but is not limited to, doped polysilicon, or metal-containing material comprising tungsten, titanium, or metal silicide. The impurity regions 2044 serve as drain and source regions of the access transistor 204 and can be formed by introducing dopants into the semiconductor wafer 202. The introduction of the dopants into the semiconductor wafer 202 is achieved by a diffusion process or an ion-implantation process. The dopant introduction may be performed using boron or indium if the respective access transistor 204 is a p-type transistor, or using phosphorous, arsenic, or antimony if the respective access transistor 204 is an n-type transistor.

The gate dielectric 2046 is employed to maintain capacitive coupling of the gate electrode 2042 and a conductive channel between the drain and source regions. The gate dielectric 2046 may include oxide, nitride, oxynitride or high-k material. The access transistor 204 may further include gate spacers 2048 on sidewalls of the gate electrode 2042 and the gate dielectric 2046. The gate spacers 2048 are optionally formed by depositing a spacer material (such as silicon nitride or silicon dioxide) to cover the gate electrode 2042 and the gate dielectric 2046, and are anisotropically etched to remove the spacer material from horizontal surfaces of the gate electrode 2042 and the gate dielectric 2046.

Isolation features 203, such as shallow trench isolation (STI) features or local oxidation of silicon (LOCOS) features, can be introduced in the semiconductor wafer 202 to define an active area 2022, wherein the access transistor 204 is formed in the active area 2022.

The insulative layer 206 covers the semiconductor wafer 202 and the access transistor 204. The insulating layer 206 can be formed by uniformly depositing a dielectric material, using, for example, a chemical vapor deposition (CVD) process or a spin-coating process, to cover an upper surface 2021 of the semiconductor wafer 202 and the access transistor 204. In some embodiments, the insulating layer 206 may be planarized, using, for example, a chemical mechanical polishing (CMP) process, to yield an acceptably flat topology. The insulating layer 206 can include oxide, tetraethyl orthosilicate (TEOS), undoped silicate glass (SOG), phosphosilicate glass (PSG), borosilicate glass (BSG), borophosphosilicate glass (BPSG), fluorosilicate glass (FSG), spin-on glass (SOG), tonen silazane (TOSZ), or a combination thereof.

The conductive plug 208 penetrates through the insulating layer 206 and contacts one of the impurity regions 2044 of the access transistor 202. The conductive plug 208 may include tungsten. Alternatively, doped polysilicon may be used as the conductive material for the formation of the conductive plug 208. The conductive plug 208 may be formed in the insulating layer 206 using a damascene process.

The sacrificial layer 420 is deposited on the substrate 200 using a spin-coating process or a CVD process. After the deposition, the sacrificial layer 420 may be planarized, using, for example, a chemical mechanical polishing (CMP) process, to yield an acceptably flat topology. The flat topology permits patterning trench, as will be described below, with lithography equipment having a reduced depth of field. In some embodiments, the sacrificial layer 420 is made of material that provides sufficient selectivity between the insulative layer 206 and the conductive plug 208. The sacrificial layer 420 may include dielectric material that is different from the insulating layer 206. In some embodiments, the sacrificial layer 420 includes silicon oxide or silicon nitride.

Next, a pattern mask 430 is formed on the sacrificial layer 420. The pattern mask 430 defines a trench pattern to be etched through the sacrificial layer 420. The pattern mask 430 may include photosensitive material and the trench pattern may be defined using a photolithography process. Alternatively, the pattern mask 430 is a hard mask.

Figure 15:
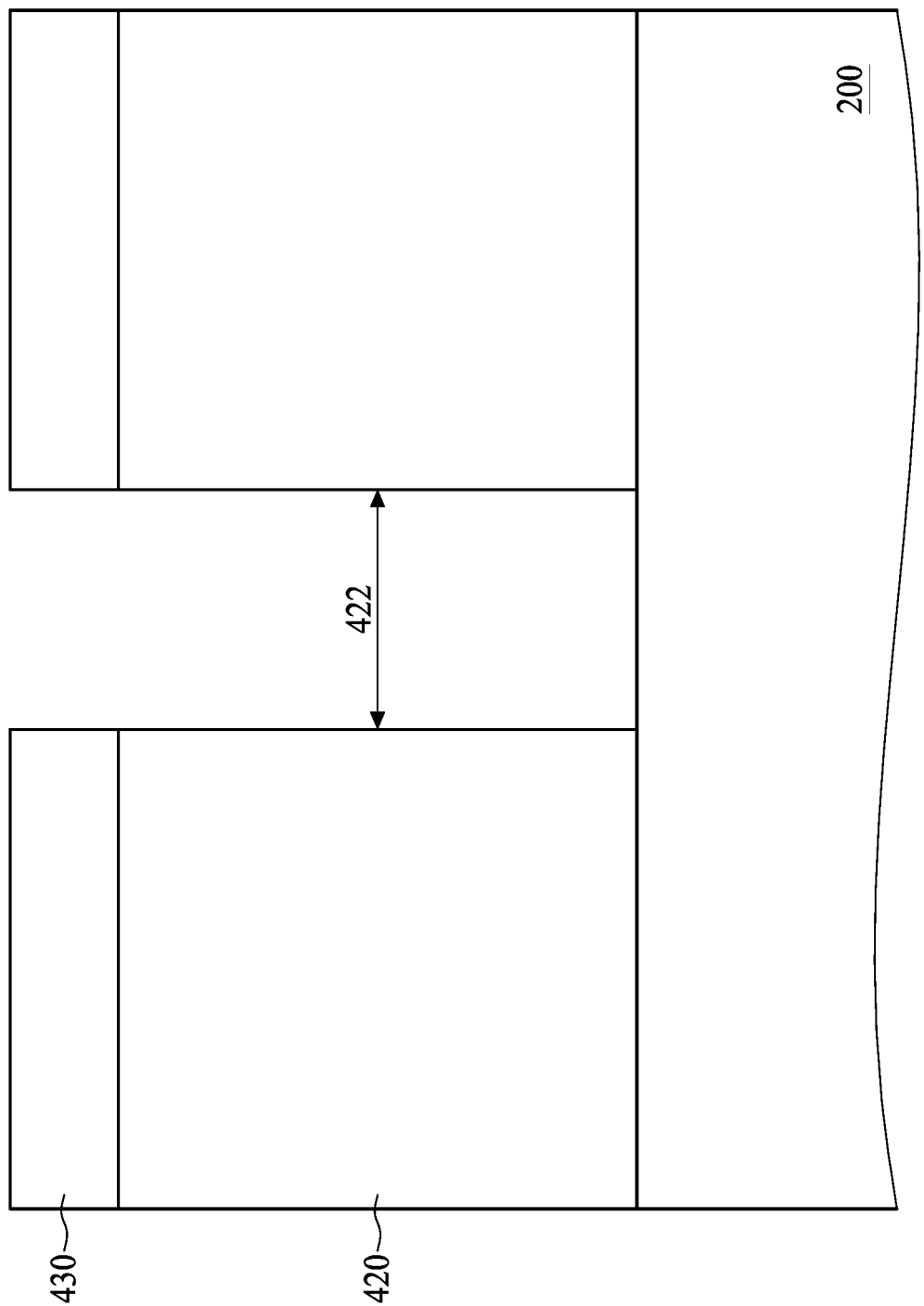

Referring to FIG. 15, an etching process is performed to remove a portion of the sacrificial layer 420 not protected by the pattern mask 430 according to step S504 in FIG. 13. Consequently, a trench 422 is formed, and a portion of the substrate 200 is exposed. The sacrificial layer 420 is etched using an RIE process, for example. After the creation of the trench 422, the pattern mask 430, including photosensitive material, is removed using an ashing process or a wet strip process, wherein the wet strip process may chemically alter the pattern mask 430 so that it no longer adheres to the sacrificial layer 420. The pattern mask 430 that is the hard mask is removed using a wet etching process. Referring to FIGS. 14 and 15, the conductive plug 208 may be exposed through the trench 422.

Figure 16:
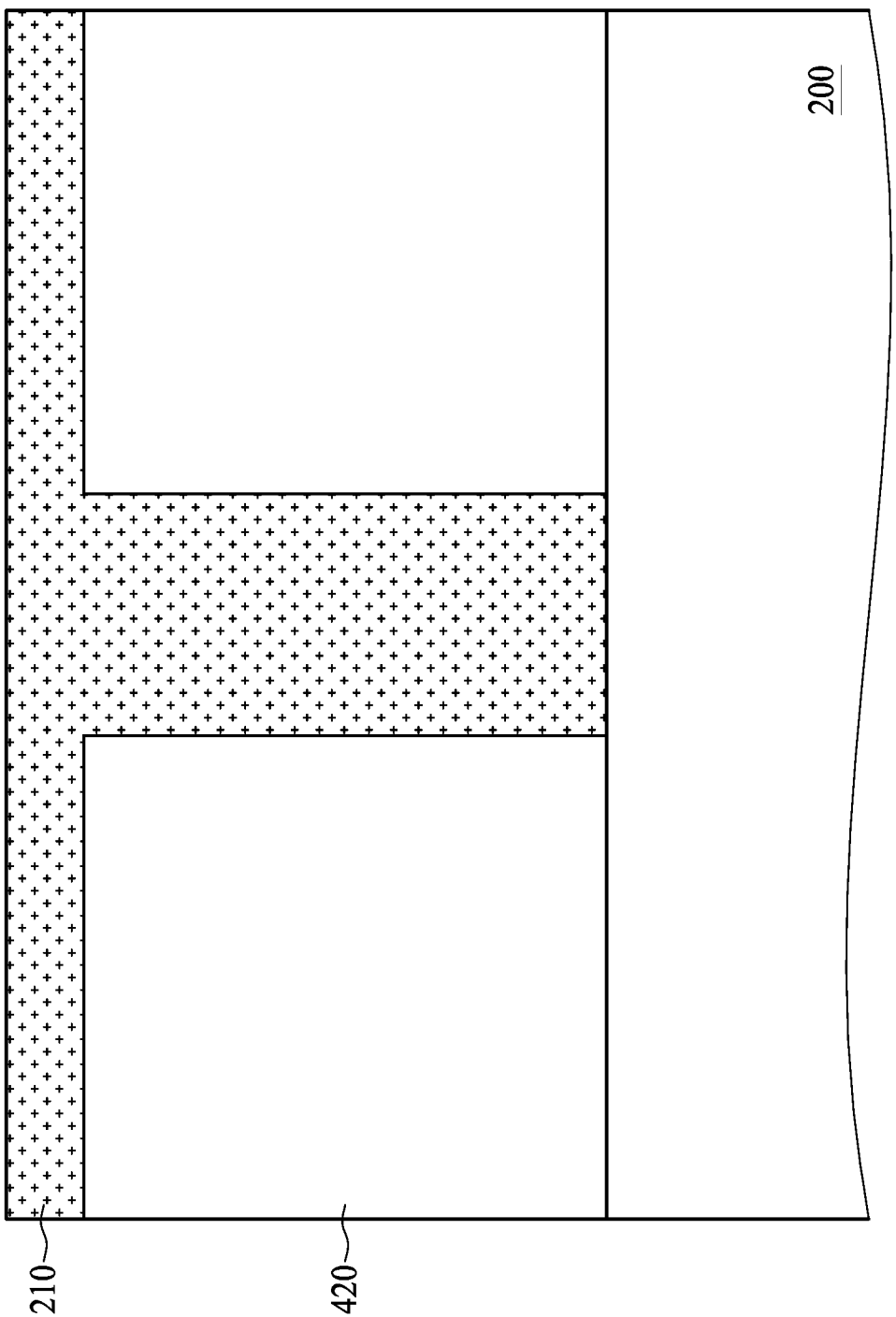

Referring to FIG. 16, the trench 422 is filled with a conductive material 210 utilizing a deposition process according to step S506 in FIG. 13. The conductive material 210 can be deposited using, for example, a low-pressure CVD process. The conductive material 210 is uniformly deposited on the substrate 200 and the sacrificial layer 420 until the trench 422 is entirely filled to facilitate the deposition of the conductive material 210. The conductive material 210 may be formed of doped polysilicon or metal such as titanium nitride (TiN) or ruthenium (Ru).

Figure 17:
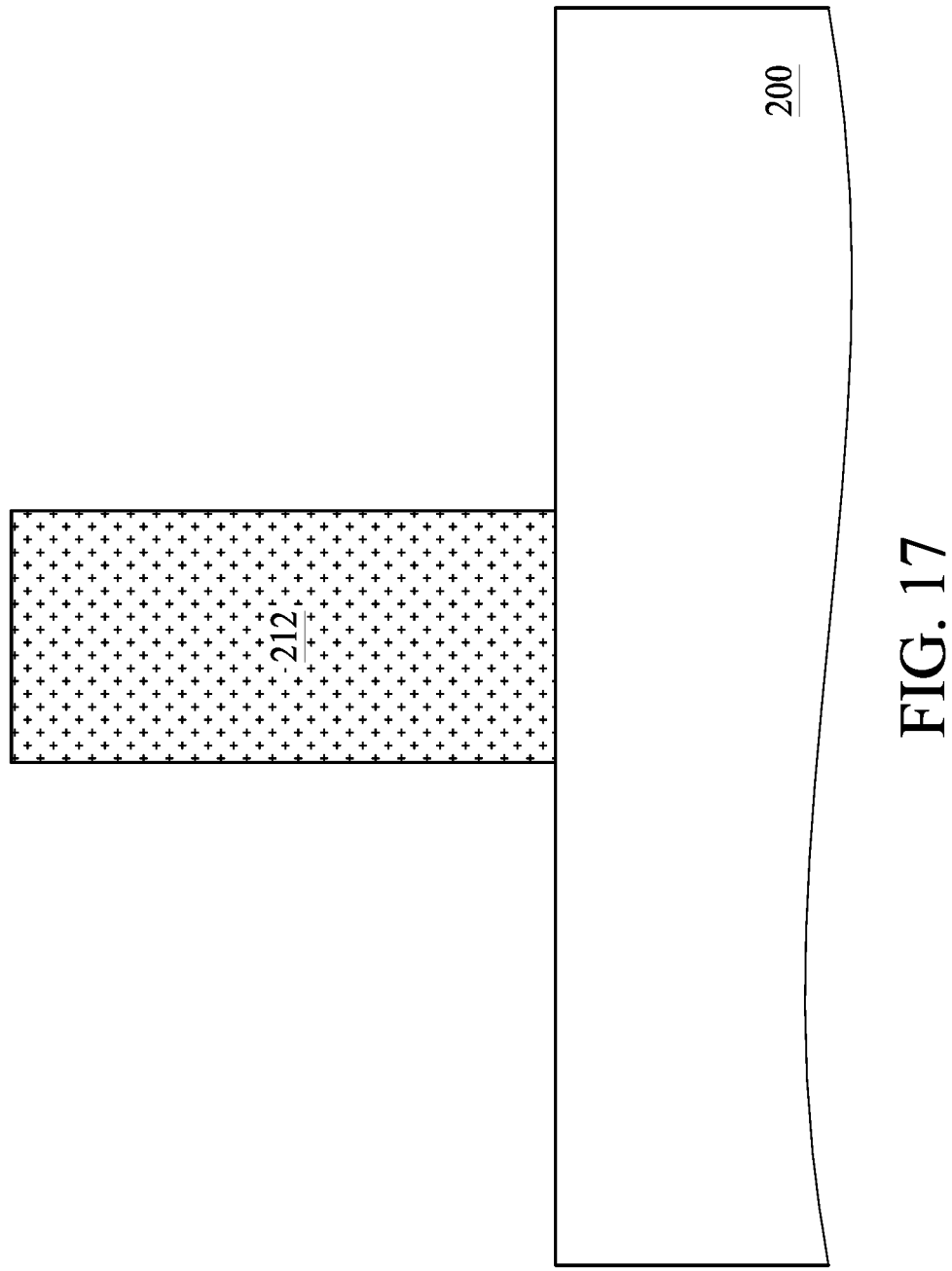

Next, the method 500 proceeds to step S508, in which a planarizing process is performed to remove the conductive material 210 above the sacrificial layer 420. Consequently, a lower electrode 212 of a pillar shape is formed. In some embodiments, the lower electrode 212 may be in contact with the conductive plug 208 shown in FIG. 14. After the removal of the superfluous conductive material 210, the sacrificial layer 420 is exposed. After complete of the formation of the lower electrode 212, the method proceeds to step S510, in which the sacrificial layer 420 is removed by a suitable technique. As such, the substrate 200 is exposed, as shown in FIG. 17.

Figure 18:
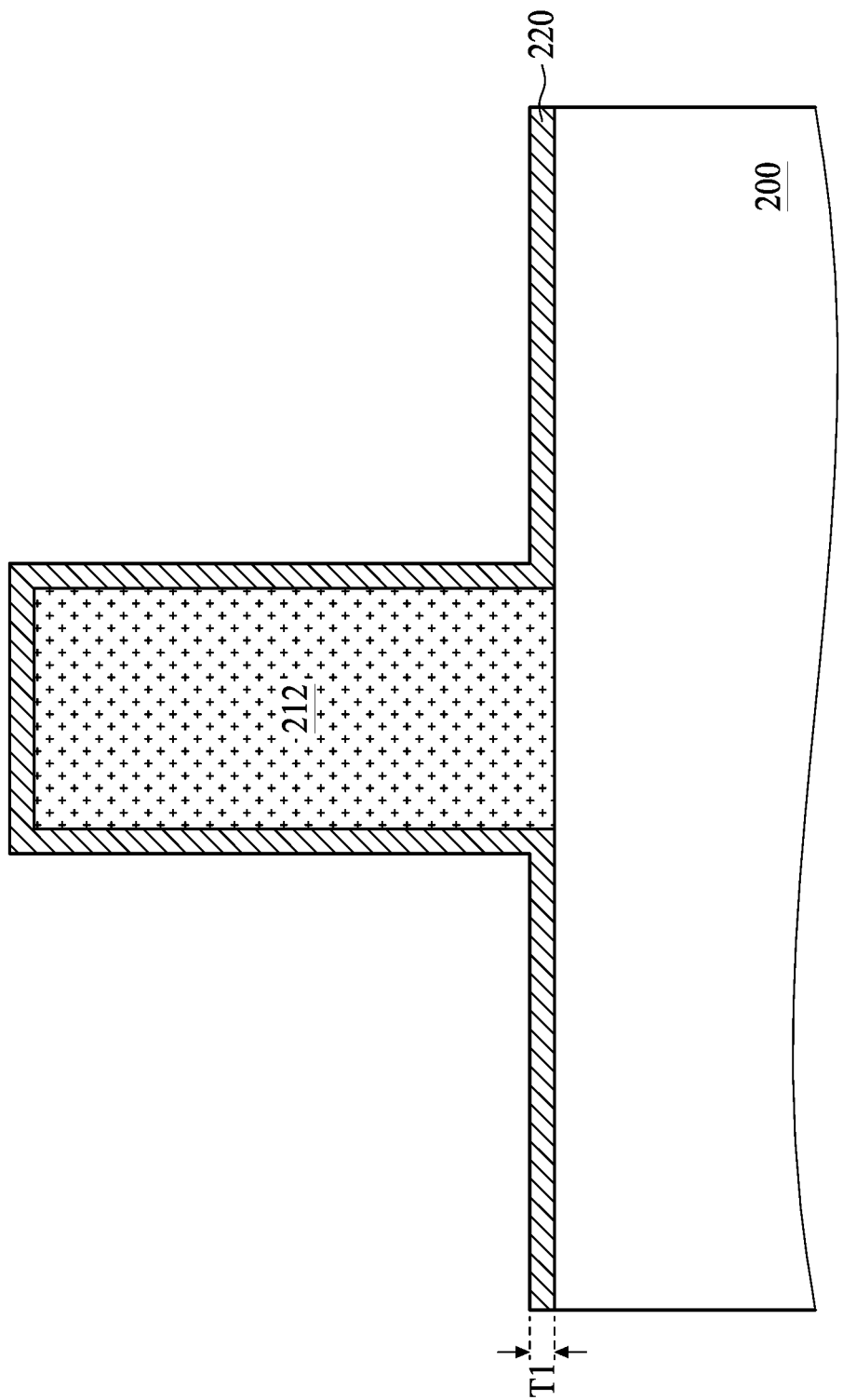

Referring to FIG. 18, a first dielectric layer 220 is deposited to cover the lower electrode 212 according to step S512 in FIG. 13. The first dielectric layer 220 includes a first metallic oxide, and is deposited on the substrate 200 and the lower electrode 212. In some embodiments, the first dielectric layer 220, having a substantially uniform first thickness T1, has a topology following the topology of the substrate 200 and the lower electrode 212. For example, the first dielectric layer 220 can include hafnium, zirconium, niobium, aluminum or titanium. The first dielectric layer 220 is deposited using a CVD process or an ALD process, for example.

Figure 19:
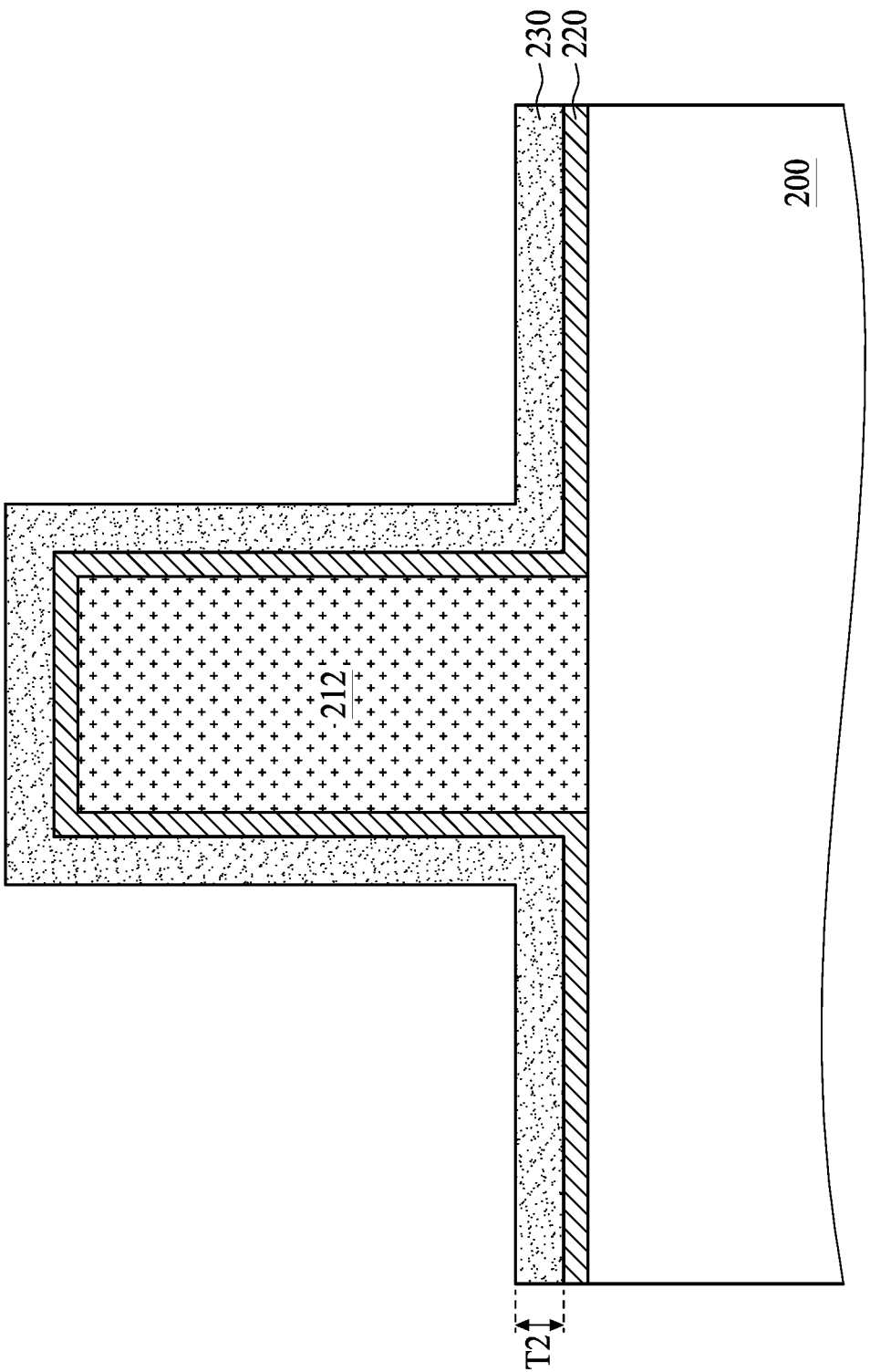

Referring to FIG. 19, a second dielectric layer 230 is deposited on the first dielectric layer 220 according to step S514 in FIG. 13. The second dielectric layer 230 is deposited on the first dielectric layer 220 until the second dielectric layer 230 has a second thickness T2. Referring to FIGS. 18 and 19, in some embodiments, the second thickness T2 is greater than the first thickness T1. The second metallic oxide is different from the first metallic oxide. For example, the second dielectric layer 230 includes hafnium or zirconium. The second dielectric layer 230, including a second metallic oxide, is deposited using a CVD process, for example.

Figure 20:
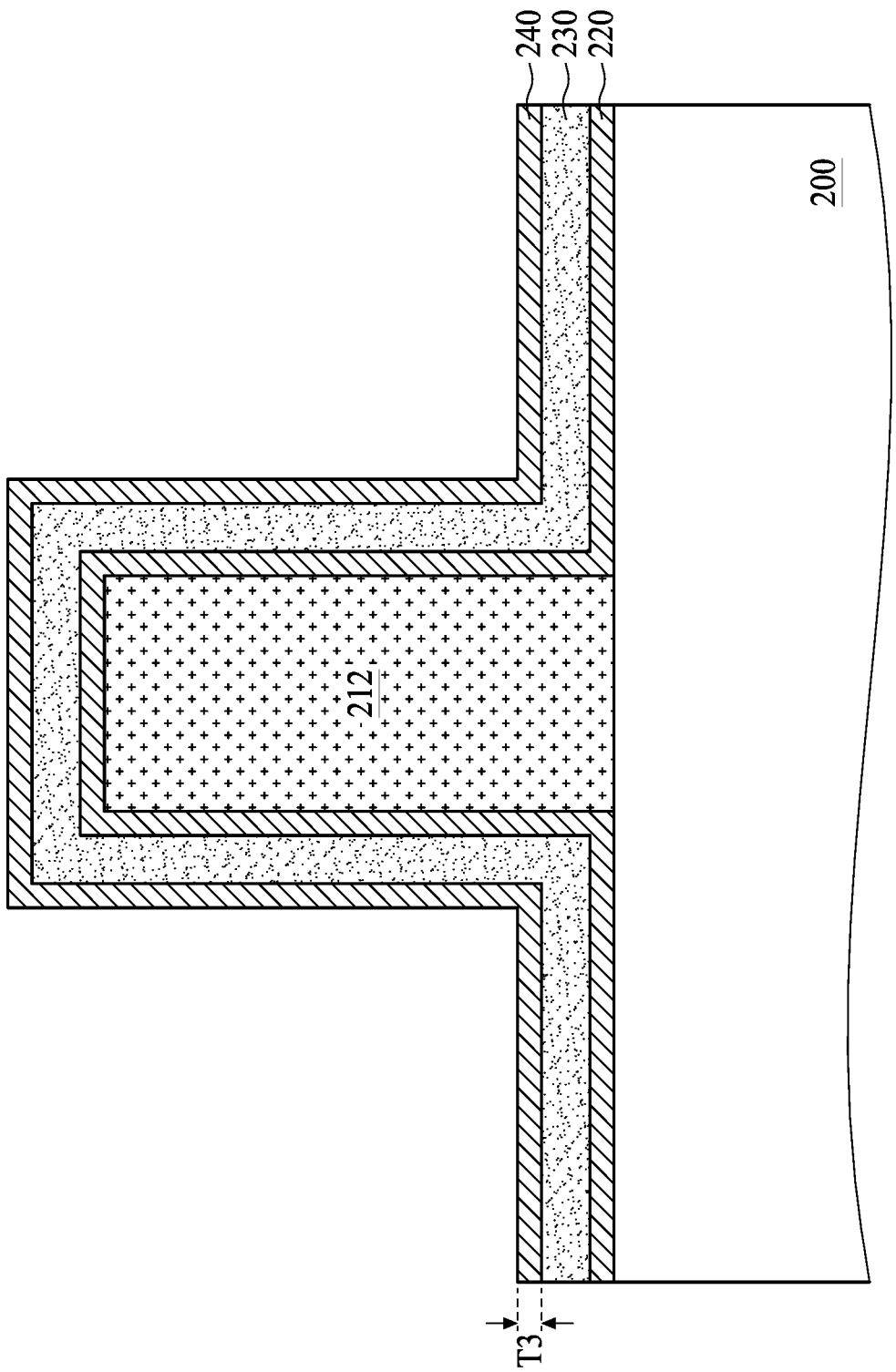

Referring to FIG. 20, a third dielectric layer 240 is deposited on the second dielectric layer 230 according to step S516 in FIG. 13. The third dielectric layer 204 is deposited using a CVD process and includes the first metallic oxide. Referring to FIGS. 18 to 20, the third dielectric layer 204 has a third thickness T3 less than the second thickness T2. A total of the first thickness T1 and the third thickness T3 is substantially less than the second thickness T2. In some embodiments, a ratio of the second thickness T2 to a total of the first thickness T1 and the third thickness T3 is substantially greater than 4.

Next, the method 500 proceeds to step S518, in which a top electrode 250 is deposited on the third dielectric layer 240. The top electrode 250 can be a conformal layer having a substantially uniform thickness. In some embodiments, the top electrode 250 may be formed of low-resistivity material, such as titanium nitride or combinations of titanium nitride, tantalum nitride, tungsten nitride, ruthenium, iridium, and platinum. Consequently, a storage capacitor 20 shown in FIG. 3 is formed. The top electrode 250 is deposited until it has a substantially smooth surface.

In conclusion, with the configuration of the storage capacitor 10/20 including the first dielectric layer 120/220, the second dielectric layer 130/230 and the third dielectric layer 140/240, an effective dielectric constant of the capacitor dielectric can be increased. Therefore, the storage capacitor 10/20 having a given footprint can hold a greater electrical charge.

One aspect of the present disclosure provides a storage capacitor. The storage capacitor comprises a lower electrode, a first dielectric layer, a second dielectric layer, a third dielectric layer and an upper electrode. The first dielectric layer covers the lower electrode. The second dielectric layer is disposed on the first dielectric layer. The third dielectric layer is disposed on the second dielectric layer. The upper electrode is disposed on the third dielectric layer.

One aspect of the present disclosure provides a method of fabricating a storage capacitor. The method comprises steps of forming a lower electrode, depositing a first dielectric layer covering the lower electrode, depositing a second dielectric layer on the first dielectric layer, depositing a third dielectric layer on the second dielectric layer, and forming an upper electrode on the third dielectric layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A storage capacitor, comprising:
a substrate;
a lower electrode formed on and in contact with the substrate;
a first dielectric layer covering the lower electrode and in contact with the substrate;
a second dielectric layer disposed on the first dielectric layer;
a third dielectric layer disposed on the second dielectric layer; and
an upper electrode disposed on the third dielectric layer;
wherein the first dielectric layer has a first thickness, the second dielectric layer has a second thickness greater than the first thickness, and the third dielectric layer has a third thickness less than the second thickness.

2. The storage capacitor of claim 1, wherein the first dielectric layer and the second dielectric layer comprise different materials.

3. The storage capacitor of claim 2, wherein the first and third layers comprise a same material.

4. The storage capacitor of claim 3, wherein the first dielectric layer, the second dielectric layer and the third dielectric layer comprise metallic oxides.

5. The storage capacitor of claim 2, wherein the first dielectric layer comprises hafnium, zirconium, niobium, aluminum or titanium.

6. The storage capacitor of claim 2, wherein the second dielectric layer comprises hafnium or zirconium.

7. The storage capacitor of claim 1, wherein a total of the first thickness and the third thickness is substantially less than the second thickness.

8. The storage capacitor of claim 1, wherein a ratio of the second thickness to a total of the first thickness and the third thickness is substantially greater than 4.

9. A storage capacitor, comprising:
a substrate;
a lower electrode formed on and in contact with the substrate;
a first dielectric layer covering the lower electrode and in contact with the substrate;
a second dielectric layer disposed on the first dielectric layer;
a third dielectric layer disposed on the second dielectric layer; and
an upper electrode disposed on the third dielectric layer;
wherein the lower electrode is formed of a solid pillar shape defining a bottom surface in contact with a top surface the substrate,
wherein a first portion of the first dielectric layer is attached to an outer surface of the lower electrode while a second portion of the first dielectric layer is in contact with the top surface of the substrate, wherein the first portion of the second dielectric layer has a first outer diameter and a first inner diameter,
wherein a first portion of the second dielectric layer surrounds an outer surface of the first portion of the first dielectric layer and a second portion of the second dielectric layer overlaps on the second portion of the first dielectric layer, wherein the first portion of the second dielectric layer has a second outer diameter and a second inner diameter,
wherein a first portion of the third dielectric layer surrounds an outer surface of the first portion of the second dielectric layer and a second portion of the third dielectric layer overlaps on the second portion of the second dielectric layer, wherein the first portion of the third dielectric layer has a third outer diameter and a third inner diameter,
wherein the upper electrode surrounds the first portion of the third dielectric layer and is in contact with the second portion of the third dielectric layer,
wherein a first difference between the first outer diameter and the first inner diameter is less than a second difference between the second outer diameter and the second inner diameter, and
wherein a third difference between the third outer diameter and the third inner diameter is less than the second difference.

10. The storage capacitor of claim 9, wherein a total of the first difference and the third difference is substantially less than 2 nm.

11. The storage capacitor of claim 9, wherein a total of the first difference and the third difference is substantially greater than 0.3 nm.

12. The storage capacitor of claim 9, wherein the upper electrode has a substantially planar top surface.

13. A storage capacitor, comprising:
a substrate;
a lower electrode formed on and in contact with the substrate;
a first dielectric layer covering the lower electrode and in contact with the substrate;
a second dielectric layer disposed on the first dielectric layer;
a third dielectric layer disposed on the second dielectric layer; and
an upper electrode disposed on the third dielectric layer;
wherein the upper electrode is formed of a solid pillar shape,
wherein a portion of the first dielectric layer surrounds an outer surface of the upper electrode and is in contact with the substrate and the lower electrode, wherein the portion of the first dielectric layer has a first outer diameter and a first inner diameter,
wherein a portion of the second dielectric layer surrounds the outer surface of the upper electrode and is surrounded within the portion of the first dielectric layer, wherein the portion of the second dielectric layer has a second outer diameter and a second inner diameter,
wherein a portion of the third dielectric layer is attached to the outer surface of the upper electrode and is surrounded within the portion of the second dielectric layer, wherein the portion of the second dielectric layer has a third outer diameter and a third inner diameter,
wherein the lower electrode integrally formed with the substrate and is in contact with the first dielectric layer,
wherein a first difference between the first outer diameter and the first inner diameter is less than a second difference between the second outer diameter and the second inner diameter, and
wherein a third difference between the third outer diameter and the third inner diameter is less than the second difference.

14. The storage capacitor of claim 13, wherein a total of the first difference and the third difference is substantially less than 2 nm, wherein each of the substrate, the first dielectric layer, the second dielectric layer, and the third dielectric layer has a U-shaped cross section, wherein top surfaces of the first dielectric layer, the second dielectric layer, the third dielectric layer are coplanar with a top surface of the substrate.

15. The storage capacitor of claim 13, wherein a total of the first difference and the third thickness is substantially greater than 0.3 nm, wherein the substrate has a trench indented from a top surface of the substrate, wherein the lower electrode is integrally formed at an inner wall of the trench, wherein the first dielectric layer, the second dielectric layer, the third dielectric layer, and the upper electrode are formed in the trench.

16. The storage capacitor of claim 13, wherein the lower electrode is a doped region of the substrate, and the first dielectric layer, the second dielectric layer, the third dielectric layer and the upper electrode are disposed in the substrate.

* * * * *